(12) United States Patent  
Goodnow et al.

(10) Patent No.: US 9,123,492 B2  
(45) Date of Patent: Sep. 1, 2015

(54) THREE-DIMENSIONAL INTER-CHIP CONTACT THROUGH VERTICAL DISPLACEMENT MEMS

(71) Applicant: International Business Machines Corporation, Armonk, NY (US)

(72) Inventors: Kenneth J. Goodnow, Essex Junction, VT (US); Todd E. Leonard, Williston, VT (US); Stephen G. Shuma, Underhill, VT (US); Peter A. Twombly, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 13/719,366

(22) Filed: Dec. 19, 2012

(65) Prior Publication Data

US 2014/0166461 A1   Jun. 19, 2014

(51) Int. Cl.

| H01L 23/48 | (2006.01) |
|---|---|
| H01L 23/52 | (2006.01) |
| H01L 29/40 | (2006.01) |
| H01L 23/02 | (2006.01) |
| H01H 59/00 | (2006.01) |
| H01L 23/528 | (2006.01) |
| H01L 23/538 | (2006.01) |
| B81B 3/00 | (2006.01) |

(52) U.S. Cl.
CPC .......... *H01H 59/0009* (2013.01); *B81B 3/0056* (2013.01); *B81B 3/0086* (2013.01); *H01L 23/528* (2013.01); *H01L 23/5386* (2013.01); *H01L 23/5389* (2013.01); *H01L 2924/1434* (2013.01); *H01L 2924/1461* (2013.01)

(58) Field of Classification Search
None
See application file for complete search history.

(56) References Cited

U.S. PATENT DOCUMENTS

| 6,809,412 | B1 * | 10/2004 | Tourino et al. | 257/678 |
|---|---|---|---|---|
| 7,022,542 | B2 * | 4/2006 | Combi et al. | 438/52 |

(Continued)

FOREIGN PATENT DOCUMENTS

KR   101099141   8/2008

OTHER PUBLICATIONS

Hyung Suk Yang et al., 3D Integration of CMOS and MEMS using Mechanically Flexible Interconnects (MFI) and Trhrough Silicong Vias (TSV), Electronic Components and Technology Conference, 2010, pp. 822-828.

(Continued)

*Primary Examiner* — Hoang-Quan Ho  
(74) *Attorney, Agent, or Firm* — Gibb & Riley, LLC; David A. Cain, Esq.

(57) ABSTRACT

An electrically conducting, vertically displacing microelectromechanical system (MEMS) is formed on a first integrated circuit chip. The first integrated circuit chip is physically connected to a three-dimensional packaging structure. The three-dimensional packaging structure maintains a fixed distance between the first integrated circuit chip and a second integrated circuit chip. A control circuit is operatively connected to the MEMS. The control circuit directs movement of the MEMS between a first position and a second position. The MEMS makes contact with a contact pad on the second integrated circuit chip when it is in the second position forming a conductive path and providing electrical communication between the first integrated circuit chip and the second integrated circuit chip. The MEMS avoids making contact with the contact pad on the second integrated circuit chip when it is in the first position.

22 Claims, 6 Drawing Sheets

(56) References Cited

U.S. PATENT DOCUMENTS

| | | | |
|---|---|---|---|
| 7,061,099 B2 * | 6/2006 | Lu et al. | 257/704 |
| 7,215,429 B2 | 5/2007 | Xie | |
| 7,330,368 B2 | 2/2008 | Saito et al. | |
| 7,745,892 B1 | 6/2010 | Ivanov et al. | |
| 7,859,360 B2 | 12/2010 | Rofougaran et al. | |
| 7,928,584 B2 | 4/2011 | O Suilleabhain et al. | |
| 8,148,814 B2 | 4/2012 | Furuta et al. | |
| 8,217,521 B2 | 7/2012 | Chen et al. | |
| 8,269,327 B2 | 9/2012 | Leedy | |
| 8,304,274 B2 * | 11/2012 | Zuniga-Ortiz et al. | 438/50 |
| 8,648,430 B2 * | 2/2014 | Zuniga-Ortiz et al. | 257/415 |
| 2004/0157364 A1 * | 8/2004 | Combi et al. | 438/106 |
| 2006/0001123 A1 * | 1/2006 | Heck et al. | 257/528 |
| 2006/0071324 A1 * | 4/2006 | Lu et al. | 257/704 |
| 2010/0207217 A1 * | 8/2010 | Zuniga-Ortiz et al. | 257/415 |
| 2010/0277210 A1 | 11/2010 | Wang et al. | |
| 2011/0034021 A1 | 2/2011 | Feng | |
| 2012/0139128 A1 * | 6/2012 | Kang | 257/774 |
| 2012/0193808 A1 | 8/2012 | Zou et al. | |

OTHER PUBLICATIONS

Self-Aligning MEMS In-Line Separable Electrical Connector Michael P. Larsson et al., Journal of Microelectromechanical Systems, vol. 13, No. 2, Apr. 2004, pp. 365-376.

M. Larsson et al., "A Micromachined Separable RF Connector Fabricated Using Low-Resistivity Silicon", Institute of Physics Publishing Journal of Micromechanics and Microengineering, J. Micromech. Microeng. 16 (2006) 2021-2033.

Microelectromechanical Systems (MEMS), pp. 1-49.

Microelectromechanical Systems (MEMS), pp. 1-49, Varadan et al.

Microstereolithography and other Fabrication Techniques for 3D MEMS. Wiley. Mar. 2001. pp. 1-49.

* cited by examiner

THREE-DIMENSIONAL INTER-CHIP CONTACT THROUGH VERTICAL DISPLACEMENT MEMS

BACKGROUND

The present disclosure relates to microelectromechanical systems (MEMS), and more specifically, to vertical displacement MEMS structure that can be used to make a physical connection between vertically stacked chips.

As three-dimensional chip stacking architectures become more prevalent, the need for a means to connect between the chips without making a permanent solder connection arises. Examples of this are: test, diagnostics, power management, clock management, data flow, ESD, etc. A means needs to be established to create this temporary connection with the least intrusion on the existing chip architectures and layouts.

Currently, the only solution is to make a permanent connection or to use an external probe or structure.

SUMMARY

This disclosure describes how a vertical displacement MEMS structure can be used to make a physical connection between vertically stacked chips. This is a circuit-controlled operation that allows connecting and disconnecting between the chips. The current solution of a fixed connection does not allow this flexibility.

According to one apparatus herein, the apparatus comprises a three-dimensional packaging structure. A first integrated circuit chip is physically connected to the three-dimensional packaging structure. A second integrated circuit chip is physically connected to the three-dimensional packaging structure. The second integrated circuit chip comprises a contact pad. The three-dimensional packaging structure maintains a fixed distance between the first integrated circuit chip and the second integrated circuit chip. An electrical conducting microelectromechanical system (MEMS) is physically connected to the first integrated circuit chip. The MEMS comprises a vertical displacement MEMS device. A control circuit is operatively connected to the MEMS. The control circuit directs movement of the MEMS between a first position and a second position. The MEMS makes electrical contact with the contact pad on the second integrated circuit chip when the MEMS is in the second position. The MEMS forms a conductive path and provides electrical communication between the first integrated circuit chip and the second integrated circuit chip when the MEMS is in the second position. The MEMS avoids making electrical contact with the contact pad on the second integrated circuit chip when the MEMS is in the first position.

According to a switch herein, an electrical conducting, vertical displacement microelectromechanical system (MEMS) is formed on a first integrated circuit chip. A control circuit is operatively connected to the vertical displacement MEMS. The control circuit directs movement of the vertical displacement MEMS between a first position and a second position resulting in displacement of the vertical displacement MEMS to make electrical contact with a contact pad on a second integrated circuit chip.

According to another device herein, the device comprises a first integrated circuit chip. An electrical conducting microelectromechanical system (MEMS) is formed on the first integrated circuit chip. The MEMS comprises a vertical displacement MEMS. A second integrated circuit chip comprises a contact pad. A control circuit is operatively connected to the MEMS. The control circuit directs movement of the MEMS between a first position and a second position resulting in contact with the contact pad on the second integrated circuit chip.

According to a method herein, a multi-layer chip is fabricated in a process. In the process, a first integrated circuit chip is selectively formed. A microelectromechanical system (MEMS) device is formed on the first integrated circuit chip. The MEMS device comprises an electrical conducting, vertical displacement MEMS and a control circuit operatively connected to the MEMS device. A second integrated circuit chip is selectively formed. A contact pad is formed on the second integrated circuit chip. The first integrated circuit chip is connected to the second integrated circuit chip using a three-dimensional packaging structure to maintain a fixed distance between the first integrated circuit chip and the second integrated circuit chip. The contact pad is aligned with the MEMS device.

BRIEF DESCRIPTION OF THE DRAWINGS

The methods and devices herein will be better understood from the following detailed description with reference to the drawings, which are not necessarily drawn to scale and in which.

DETAILED DESCRIPTION

Figure 1:
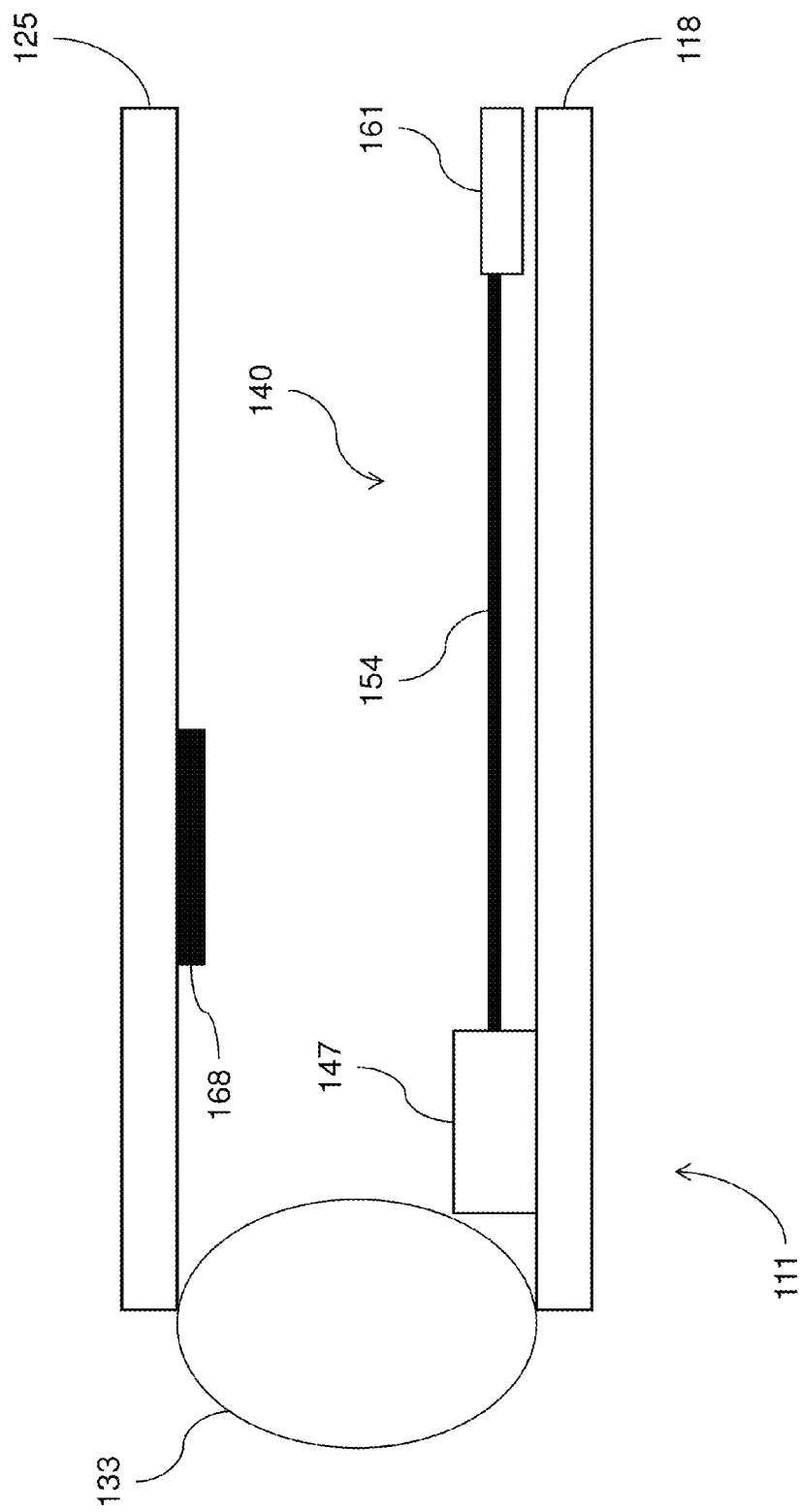
FIG. 1 is a block diagram illustrating methods and devices herein.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Flip chip is a method for interconnecting semiconductor devices, such as IC chips and MEMS, to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect. This is in contrast to wire bonding, in which the chip is mounted upright, and wires are used to interconnect the chip pads to external circuitry.

As mentioned above, as three-dimensional packaging becomes more main line, the ability to use these three-dimensional stacks in different ways becomes of concern. Current three-dimensional stacking art is mainly concerned with technological hurdles of making three-dimensional stacks manufacturable. Typically, a circuit chip has an integrated circuit formed on only one side. When stacking wafers, the side of the wafer without the integrated circuit of one chip is placed adjacent to the side of the wafer with the integrated circuit of another chip. The current art for three-dimensional interconnection of chips uses a through-silicon via (TSV), which is a vertical electrical connection passing completely through a silicon wafer that provides an electrical path from the side of the wafer having the integrated circuit to the opposite side of the wafer. Solder balls may be used to connect one chip with another. A TSV or solder ball, however, provides a permanent connection. There is no means to connect/disconnect between the connected chips in a functional mode. The systems and methods herein address these issues by using a vertical displacement MEMS device that allows electrical conduction. According to methods and devices herein, one chip may be connected to either a flipped chip or a chip with a pad on the bottom side using known connection technology. The gap between the chips can be bridged with the vertical displacement MEMS, as described below.

FIG. 1 illustrates one example in which two integrated circuit chips are stacked vertically in a three-dimensional packaging structure, indicated generally as 111. The packaging structure 111 includes a first integrated circuit (IC) chip 118 and a second IC chip 125. As shown, the second IC chip 125 is stacked vertically in relation to the first IC chip 118. The first IC chip 118 is held at a fixed distance from the second IC chip 125 by controlled collapse chip connection (C4) 133 in the packaging structure 111, or by other techniques known by one of skill in the art. The first IC chip 118 contains a vertical displacement MEMS device 140. The MEMS device 140 has an anchor 147 connected to the first IC chip 118. A flexible diaphragm 154 is connected to the anchor 147, and a movable actuator plate 161 is connected to the flexible diaphragm 154. As can be seen in FIG. 1, the flexible diaphragm 154 is connected between the anchor 147 and the movable actuator plate 161. The MEMS device 140, when activated, will cause the flexible diaphragm 154 to move vertically and make contact with the second IC chip 125 suspended above the first IC chip 118 containing the MEMS device 140. The contact with the second IC chip 125 is made to a contact pad 168. The contact pad 168 is aligned with the MEMS device 140.

Figure 2:
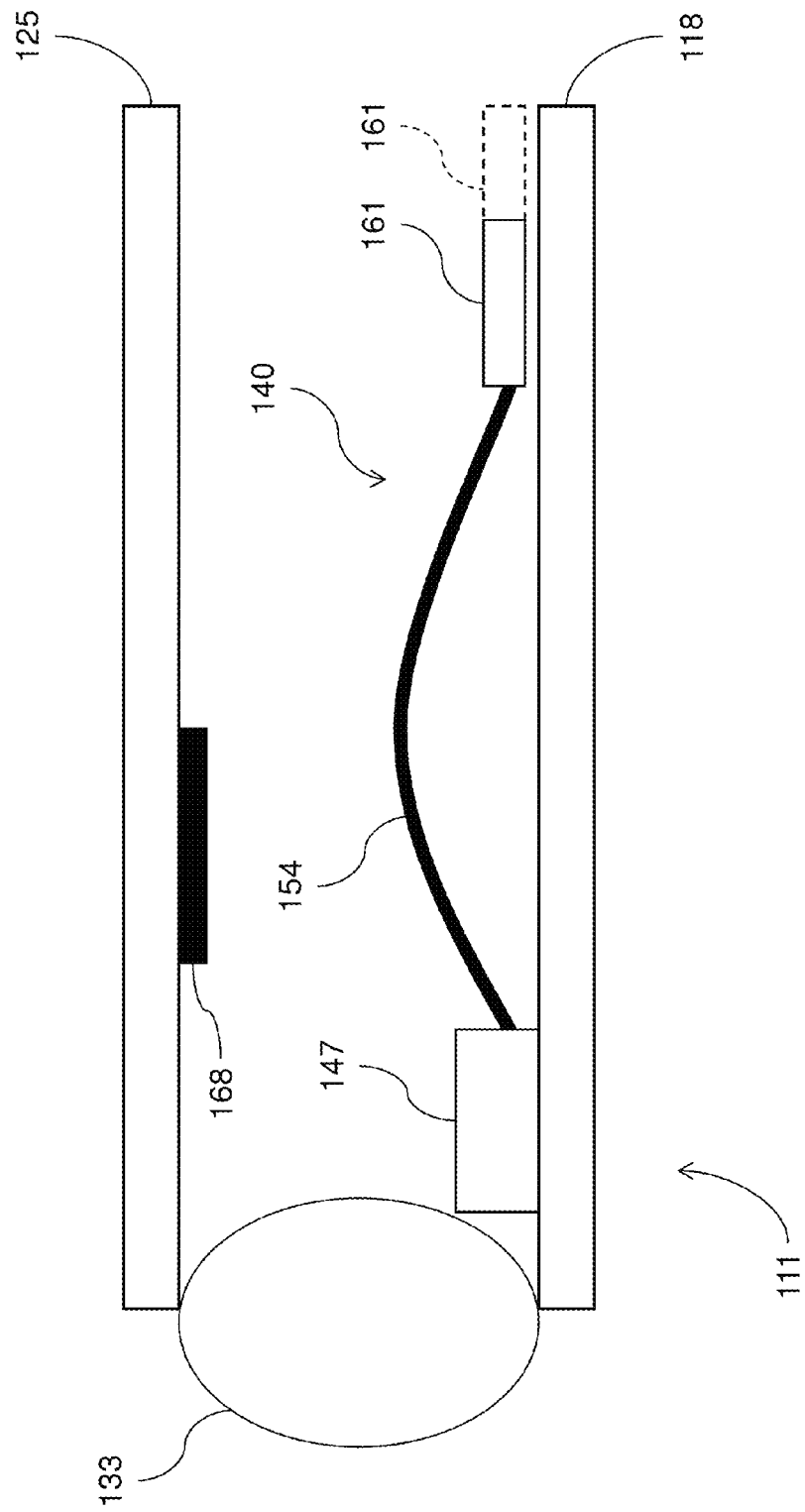
FIG. 2 is a block diagram illustrating methods and devices herein.
Figure 3:
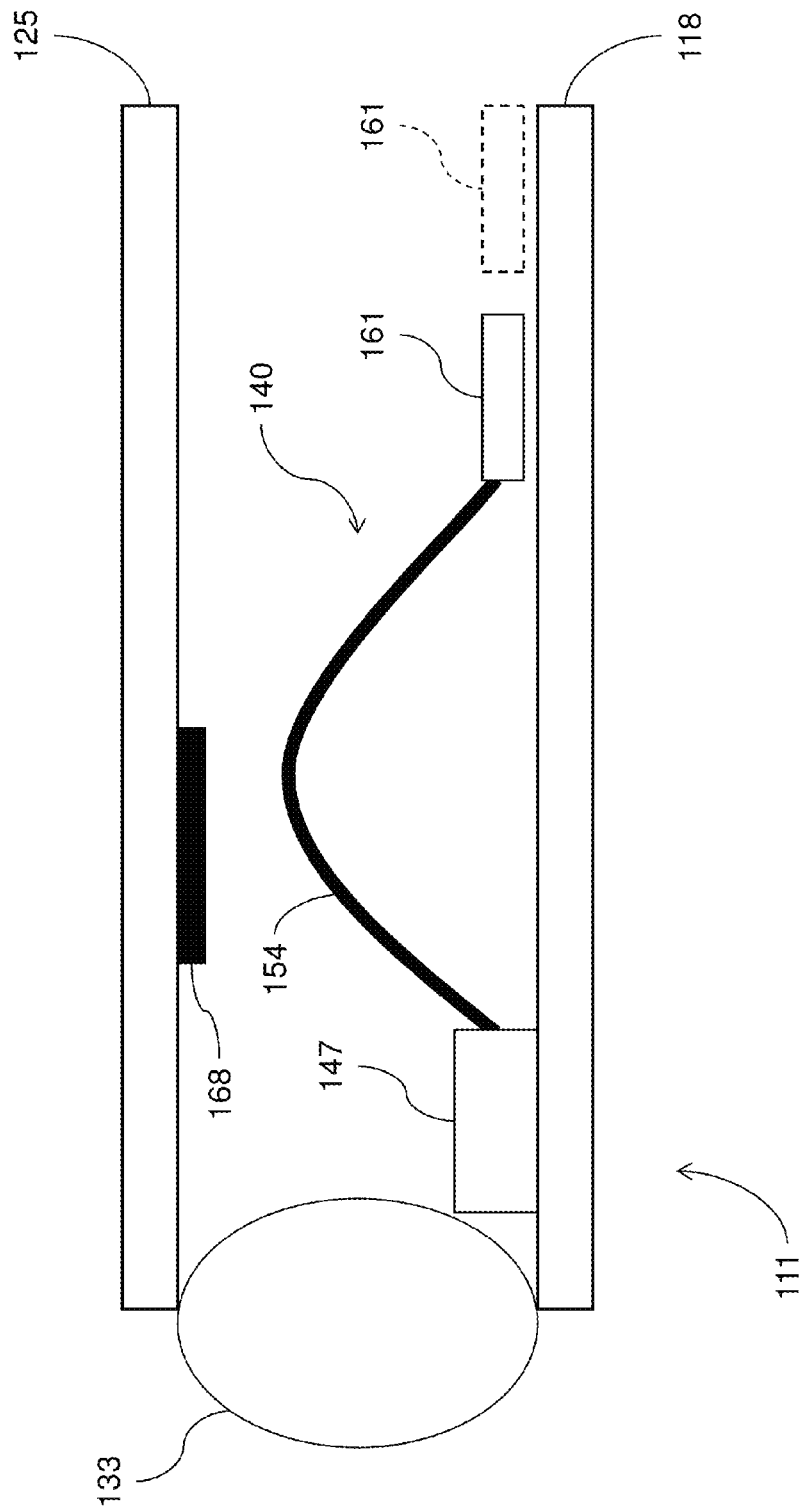
FIG. 3 is a block diagram illustrating methods and devices herein.
Figure 4:
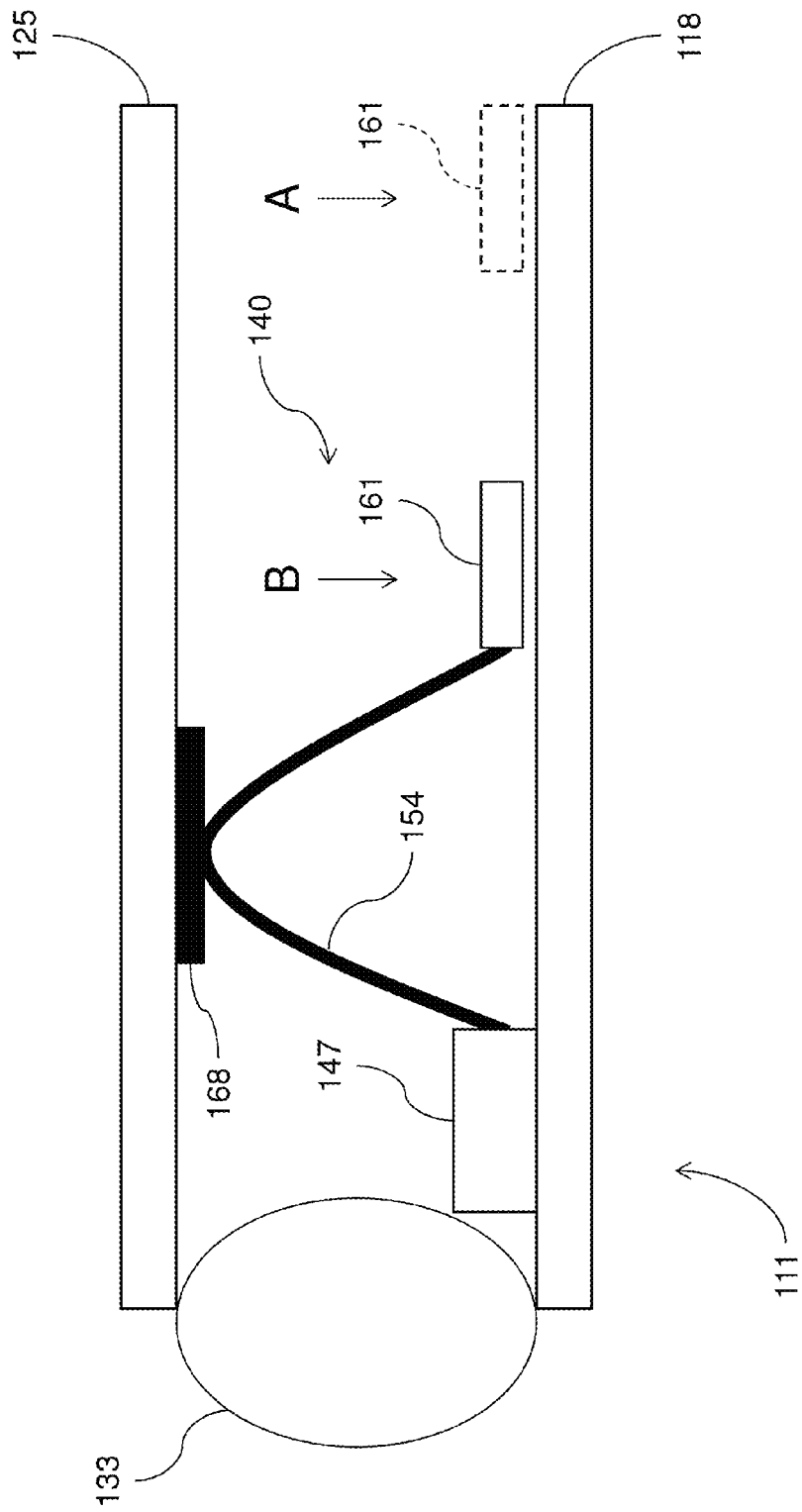
FIG. 4 is a block diagram illustrating methods and devices herein.

According to methods and devices herein, the MEMS device 140 may be a vertical displacement MEMS. FIGS. 2-4 illustrate how the MEMS device 140 works by putting compression force on the flexible diaphragm 154 as a result of moving the movable actuator plate 161 from a first position, indicated by A in FIG. 4, toward the anchor 147, and into a second position, indicated by B in FIG. 4. The flexible diaphragm 154 then deflects toward the second IC chip 125 to alleviate the compression. This movement is controlled so that that only path of deflection is in a vertical path.

According to methods and devices herein, the flexible diaphragm 154 is formed of an electrically conductive material. When the flexible diaphragm 154 contacts the contact pad 168, an electrical connection is made through the MEMS device 140 from the first IC chip 118 to the second IC chip 125. The electrical connection is made by contact only; that is, the flexible diaphragm 154 touches the contact pad 168, and remains there only so long as the movable actuator plate 161 maintains a force against the flexible diaphragm 154.

While the examples herein show a flexible diaphragm as an electrically conductive component of the MEMS device, it is contemplated that other appropriate vertical displacement MEMS, such as beams or levers, may be used to provide electrical connection between stacked die.

Figure 5:
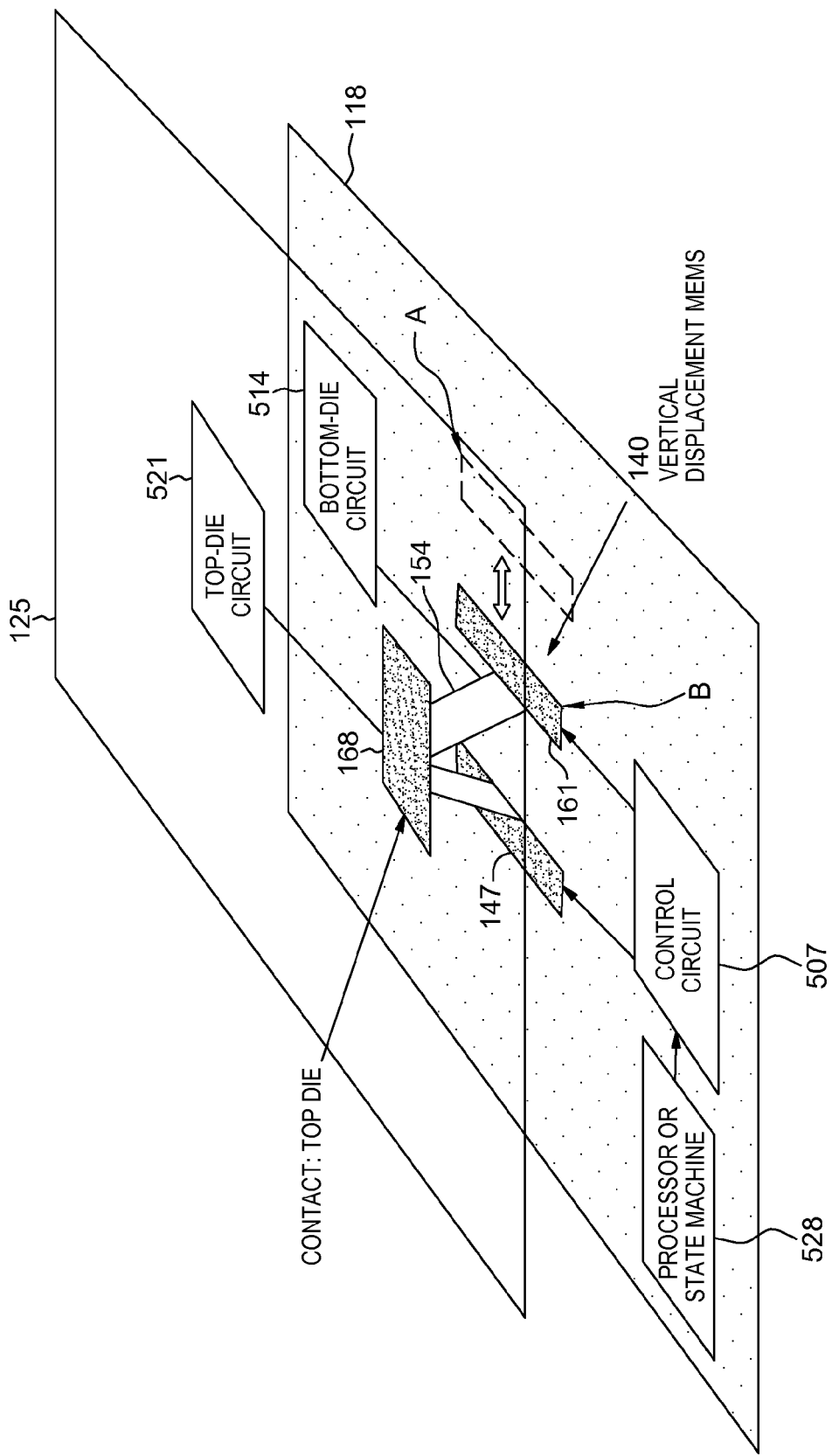
FIG. 5 is a schematic diagram illustrating methods and devices herein.

Referring to FIG. 5, the control of the vertical connector of the MEMS device 140 may be accomplished through a control circuit 507 that controls the movable actuator plate 161 of the MEMS device 140. FIG. 5 illustrates a control circuit 507 controlling the MEMS device 140 and the electrical connection between the two IC chips 118, 125. (The C4's are not shown for clarity.) The control circuit 507 directs movement of the movable actuator plate 161 between a first position, indicated by A, and a second position, indicated by B. The flexible diaphragm 154 makes electrical contact with the contact pad 168 on the second IC chip 125 (shown as the top chip in relation to the stack) when the movable actuator plate 161 is in the second position B. The flexible diaphragm 154 forms a conductive path and provides electrical communication between an integrated circuit 514 on the first IC chip 118 (shown as the bottom chip in relation to the stack) and an integrated circuit 521 on the second IC chip 125 when the movable actuator plate 161 is in the second position B. When the movable actuator plate 161 is in the first position A, the flexible diaphragm 154 does not make electrical contact with the contact pad 168 on the second IC chip 125.

In this fashion, the MEMS device 140 can function as a switch under control of a processor 528 and/or the control circuit 507. The number of cycles of the switch is dependent only on the stress resistance of the components of the MEMS device 140.

In some devices, the contact pad 168 of the second IC chip 125 may be connected to a portion of another vertical displacement MEMS controlled by a second control circuit. A complete electrical connection may be made only when both control circuits direct their respective vertical displacement MEMS to extend, as described above.

Alternatively, or in addition, there may be more than one integrated circuit chip in the three-dimensional stack, in line with the first IC chip. In some devices, the vertically displacement MEMS contacts all of the IC chips in the stack.

Furthermore, the illustrations herein show the second IC chip 125 being above the first IC chip 118. It is contemplated that the IC chips may be in a three dimensional die stack structure and that the MEMS device may extend above or below the chip on which it is formed.

Figure 6:
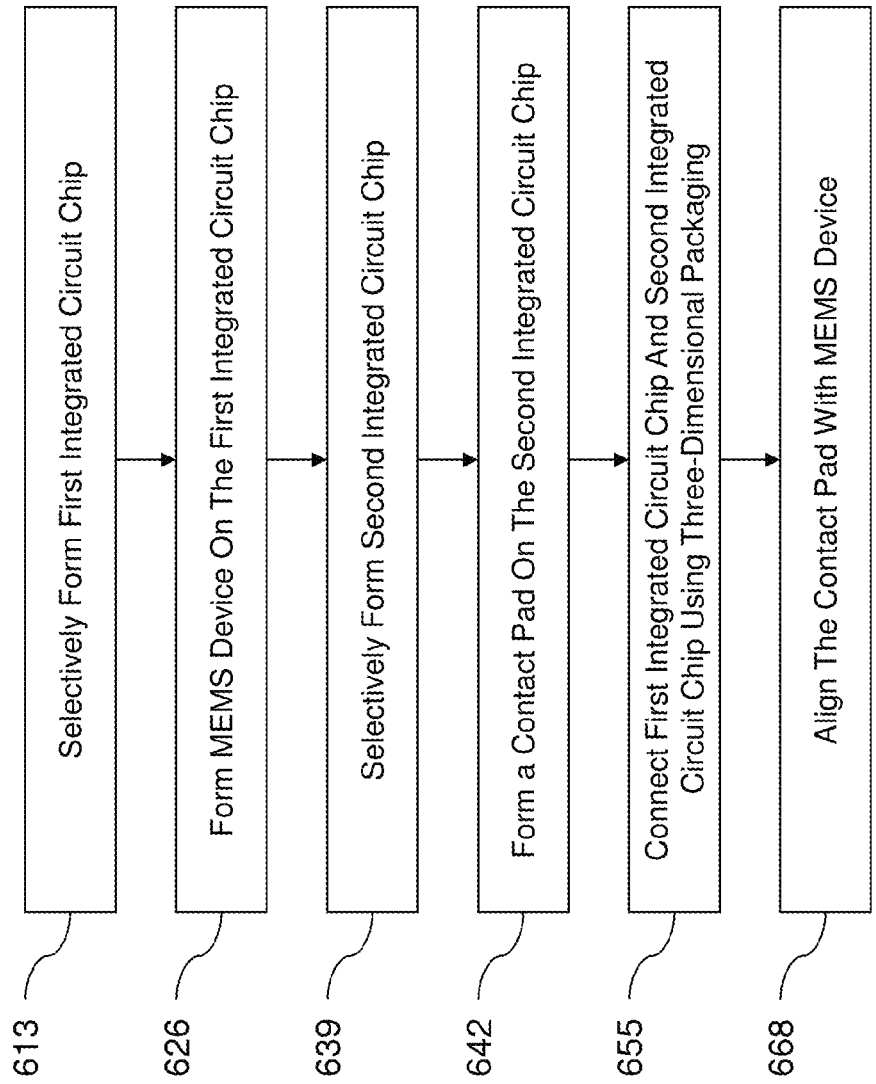
FIG. 6 is a flow diagram illustrating methods and devices herein.

FIG. 6 is a flow diagram illustrating the processing flow of an exemplary method of fabricating a multi-layer chip according to methods and devices herein. In item 613 a first integrated circuit (IC) chip is selectively formed. A microelectromechanical system (MEMS) device is formed on the first IC chip, at 626. The MEMS device comprises a vertical displacement MEMS. A control circuit is operatively connected to the movable actuator plate. At 639, a second integrated circuit chip is selectively formed. A contact pad is formed on the second integrated circuit chip, at 642. The first integrated circuit chip is connected to the second integrated circuit chip, at 655. The connection uses a three-dimensional packaging structure to maintain a fixed distance between the first integrated circuit chip and the second integrated circuit chip. The contact pad is aligned with the MEMS device, at 668.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

A hardmask can be formed of any suitable material, whether now known or developed in the future, such as a metal or organic hardmask, that has a hardness greater than the substrate and insulator materials used in the remainder of the structure.

The terminology used herein is for the purpose of describing particular methods and devices only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various methods and devices herein have been presented for purposes of illustration, but are not intended to be exhaustive or limited to the methods and devices disclosed. Many modifications and variations will be apparent to those of ordinary skill in the art without departing from the scope and spirit of the described methods and devices. The terminology used herein was chosen to best explain the principles of the methods and devices herein, the practical application or technical improvement over technologies found in the marketplace, or to enable others of ordinary skill in the art to understand the methods and devices disclosed herein.

What is claimed is:

1. An apparatus comprising:
   a three-dimensional packaging structure;
   a first integrated circuit chip physically connected to said three-dimensional packaging structure;
   a second integrated circuit chip physically connected to said three-dimensional packaging structure, said second integrated circuit chip comprising a contact pad;
   an electrical conducting microelectromechanical system (MEMS) physically connected to said first integrated circuit chip, said MEMS comprising:
      an anchor physically connected to said first integrated circuit chip,
      a flexible diaphragm physically connected to said anchor, and
      a movable actuator physically connected to said flexible diaphragm, said flexible diaphragm being physically connected between said anchor and said movable actuator; and
   a control circuit operatively connected to said MEMS;
      said three-dimensional packaging structure maintaining a fixed distance between said first integrated circuit chip and said second integrated circuit chip,
      said control circuit directing movement of said movable actuator between a first position and a second position placing a compression force on said flexible diaphragm,
      said flexible diaphragm making electrical contact with said contact pad on said second integrated circuit chip when said movable actuator is in said second position,
      said MEMS forming a conductive path and providing electrical communication between said first integrated circuit chip and said second integrated circuit chip when said movable actuator is in said second position, and
      said flexible diaphragm not making electrical contact with said contact pad on said second integrated circuit chip when said movable actuator is in said first position.

2. The apparatus according to claim 1, said three-dimensional packaging structure comprising at least one solder bump.

3. The apparatus according to claim 1, said second integrated circuit chip being vertically stacked in relation to said first integrated circuit chip, and
   said contact pad being aligned with said MEMS.

4. The apparatus according to claim 1, said contact pad of said second integrated circuit chip comprising a portion of another MEMS.

5. The apparatus according to claim 1, said three-dimensional packaging structure comprising a plurality of integrated circuit chips comprising a contact pad, and
said flexible diaphragm making electrical contact with each contact pad of said plurality of integrated circuit chips when said movable actuator is in said second position.

6. A switch comprising:
an electrical conducting, vertical displacement microelectromechanical system (MEMS) formed on a first integrated circuit chip, said vertical displacement MEMS comprising:
an anchor physically connected to said first integrated circuit chip,
a flexible diaphragm physically connected to said anchor, and
a movable actuator physically connected to said flexible diaphragm, said flexible diaphragm being physically connected between said anchor and said movable actuator; and
a control circuit operatively connected to said vertical displacement MEMS, said control circuit directing movement of said movable actuator between a first position and a second position thereby placing a compression force on said flexible diaphragm and deflecting said flexible diaphragm in a bow resulting in displacement of said vertical displacement MEMS to make contact with a contact pad on a second integrated circuit chip.

7. The switch according to claim 6, said flexible diaphragm making contact with said contact pad on said second integrated circuit chip when said vertical displacement MEMS is in said second position,
said vertical displacement MEMS forming a conductive path and providing electrical communication between said first integrated circuit chip and said second integrated circuit chip when said movable actuator is in said second position, and
said flexible diaphragm not making contact with said contact pad on said second integrated circuit chip when said movable actuator is in said first position.

8. The switch according to claim 6, further comprising:
a three-dimensional packaging structure maintaining a fixed distance between said first integrated circuit chip and said second integrated circuit chip.

9. The switch according to claim 6, said second integrated circuit chip being vertically stacked in relation to said first integrated circuit chip, and said contact pad on said second integrated circuit chip being aligned with said vertical displacement MEMS.

10. The switch according to claim 6, said contact pad of said second integrated circuit chip comprising a portion of another MEMS.

11. The switch according to claim 6, further comprising a plurality of integrated circuit chips comprising a contact pad, and
said flexible diaphragm making contact with each said contact pad of said plurality of integrated circuit chips when said movable actuator is in said second position.

12. A device comprising:
a first integrated circuit chip;
an electrical conducting microelectromechanical system (MEMS) formed on said first integrated circuit chip, said MEMS comprising:
an anchor physically connected to said first integrated circuit chip,
a flexible diaphragm physically connected to said anchor, and
a movable actuator physically connected to said flexible diaphragm, said flexible diaphragm being physically connected between said anchor and said movable actuator;
a second integrated circuit chip comprising a contact pad; and
a control circuit operatively connected to said MEMS, said control circuit directing movement of said movable actuator between a first position and a second position thereby placing a compression force on said flexible diaphragm and deflecting said flexible diaphragm in a bow resulting in said flexible diaphragm contacting with said contact pad on said second integrated circuit chip.

13. The device according to claim 12, said flexible diaphragm making contact with said contact pad on said second integrated circuit chip when said movable actuator is in said second position,
said MEMS forming a conductive path and providing electrical communication between said first integrated circuit chip and said second integrated circuit chip when said movable actuator is in said second position, and
said flexible diaphragm not making contact with said contact pad on said second integrated circuit chip when said movable actuator is in said first position.

14. The device according to claim 12, further comprising:
a three-dimensional packaging structure maintaining a fixed distance between said first integrated circuit chip and said second integrated circuit chip.

15. The device according to claim 12, said contact pad of said second integrated circuit chip comprising a portion of another MEMS.

16. The device according to claim 12, further comprising a plurality of integrated circuit chips comprising a contact pad, and
said flexible diaphragm making contact with each said contact pad of said plurality of integrated circuit chips when said movable actuator is in said second position.

17. A device comprising:
a first integrated circuit chip comprising a microelectromechanical system (MEMS), said MEMS comprising:
an anchor physically connected to said first integrated circuit chip,
a flexible diaphragm physically connected to said anchor, and
a movable actuator physically connected to said flexible diaphragm, said flexible diaphragm being physically connected between said anchor and said movable actuator; and
a control circuit operatively connected to said MEMS, said control circuit directing movement of said movable actuator between a first position and a second position placing a compression force on said flexible diaphragm resulting in displacement of said flexible diaphragm in a bow to make contact with a contact pad on a second integrated circuit chip.

18. The device according to claim 17, said flexible diaphragm making contact with said contact pad on said second integrated circuit chip when said movable actuator is in said second position,
said MEMS forming a conductive path and providing electrical communication between said first integrated circuit chip and said second integrated circuit chip when said movable actuator is in said second position, and said MEMS not making contact with said contact pad on said second integrated circuit chip when said movable actuator is in said first position.

19. The device according to claim 17, further comprising:
a three-dimensional packaging structure maintaining a fixed distance between said first integrated circuit chip and said second integrated circuit chip.

20. The device according to claim 17, said second integrated circuit chip being vertically stacked in relation to said first integrated circuit chip, and
said contact pad on said second integrated circuit chip being aligned with said MEMS.

21. The device according to claim 17, said contact pad of said second integrated circuit chip comprising a portion of another MEMS.

22. The device according to claim 17, further comprising a plurality of integrated circuit chips comprising a contact pad, and
said flexible diaphragm making contact with each said contact pad of said plurality of integrated circuit chips when said movable actuator is in said second position.

* * * * *